(12) United States Patent
Yang et al.

(10) Patent No.: US 8,603,859 B2
(45) Date of Patent: Dec. 10, 2013

(54) INTEGRATED CIRCUIT PACKAGING SYSTEM WITH DUAL SIDE MOLD AND METHOD OF MANUFACTURE THEREOF

(75) Inventors: DeokKyung Yang, Hanam-si (KR); DaeSik Choi, Seoul (KR)

(73) Assignee: Stats Chippac Ltd., Singapore (SG)

( * ) Notice: Subject to any disclaimer, the term of this patent is extended or adjusted under 35 U.S.C. 154(b) by 77 days.

(21) Appl. No.: 13/235,202

(22) Filed: Sep. 16, 2011

(65) Prior Publication Data
US 2013/0069240 A1    Mar. 21, 2013

(51) Int. Cl.
*H01L 21/44* (2006.01)
*H01L 21/48* (2006.01)
*H01L 21/50* (2006.01)

(52) U.S. Cl.
USPC ........... 438/106; 438/112; 438/127; 438/487; 257/E21.499; 257/E21.502; 257/E21.503; 257/E21.508; 257/E21.511; 257/E21.517

(58) Field of Classification Search
USPC ......... 438/106, 108, 109, 112, 124, 126, 127, 438/118, 123, 455, 457, 487, 700; 257/E21.499, E21.502, E21.503, 257/E21.508, E21.511, E21.517
See application file for complete search history.

(56) References Cited

U.S. PATENT DOCUMENTS

| | | | |
|---|---|---|---|
| 6,137,164 A * | 10/2000 | Yew et al. | 257/686 |
| 6,339,254 B1 * | 1/2002 | Venkateshwaran et al. | 257/686 |
| 6,798,057 B2 | 9/2004 | Bolkin et al. | |
| 7,170,158 B2 | 1/2007 | Choi et al. | |
| 7,185,426 B1 | 3/2007 | Hiner et al. | |
| 8,319,338 B1 * | 11/2012 | Berry et al. | 257/738 |
| 2007/0216006 A1 | 9/2007 | Park et al. | |
| 2009/0140408 A1 | 6/2009 | Lee et al. | |

* cited by examiner

*Primary Examiner* — David Nhu
(74) *Attorney, Agent, or Firm* — Ishimaru & Associates LLP; I-Chang John Yang

(57) ABSTRACT

A method of manufacture of an integrated circuit packaging system includes: providing a substrate; mounting a top integrated circuit on a first side of the substrate; mounting a bottom integrated circuit on a second side of the substrate; forming a top encapsulation over the top integrated circuit and a bottom encapsulation over the bottom integrated circuit simultaneously; and forming a bottom via through the bottom encapsulation to the substrate.

20 Claims, 6 Drawing Sheets

INTEGRATED CIRCUIT PACKAGING SYSTEM WITH DUAL SIDE MOLD AND METHOD OF MANUFACTURE THEREOF

TECHNICAL FIELD

The present invention relates generally to an integrated circuit packaging system, and more particularly to an integrated circuit packaging system with a molded via.

BACKGROUND ART

Current semiconductor packaging technology often involves tradeoffs between ease and efficiency of manufacturing on the one hand, and various performance drawbacks on the other. For example, a tremendous market growth for high density and high output/input integrated circuit packages has resulted in a trend for electronic products that are lightweight, smaller in size, multi-functional, and with ever increasing higher speeds. Electronic products such as cell phone base products, global positioning systems (GPS), satellites, communication equipment, consumer products, and a vast line of other similar products are in ever increasing global demand.

There is an important need that exists for parts in the package to become thinner and thinner to reduce the size of the whole package effectively without sacrificing performance and speed. Attempts have failed to provide a complete solution addressing simplified manufacturing processing, time to market, improved reliability, reduced electrical parts on the circuit boards, and size reductions of the circuit boards with increased functionality, leveragability, and increased product features to the consumer.

Thus, an increasing need remains to reduce parts mounted on the circuit boards while increasing functionality. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in art.

DISCLOSURE OF THE INVENTION

The present invention provides a method of manufacture of an integrated circuit packaging system including: providing a substrate; mounting a top integrated circuit on a first side of the substrate; mounting a bottom integrated circuit on a second side of the substrate; forming a top encapsulation over the top integrated circuit and a bottom encapsulation over the bottom integrated circuit simultaneously; and forming a bottom via through the bottom encapsulation to the substrate.

The present invention provides an integrated circuit packaging system including: a substrate; a top integrated circuit mounted on the substrate; a bottom integrated circuit mounted on an opposite side of the substrate from the top integrated circuit; a top encapsulation over the top integrated circuit; a bottom encapsulation over the bottom integrated circuit having characteristics of having been formed simultaneously with the top encapsulation; and a bottom via through the bottom encapsulation to the substrate.

Certain embodiments of the invention have other steps or elements in addition to or in place of those mentioned above. The steps or elements will become apparent to those skilled in art from a reading of the following detailed description when taken with reference to accompanying drawings.

BEST MODE FOR CARRYING OUT THE INVENTION

Figure 1:
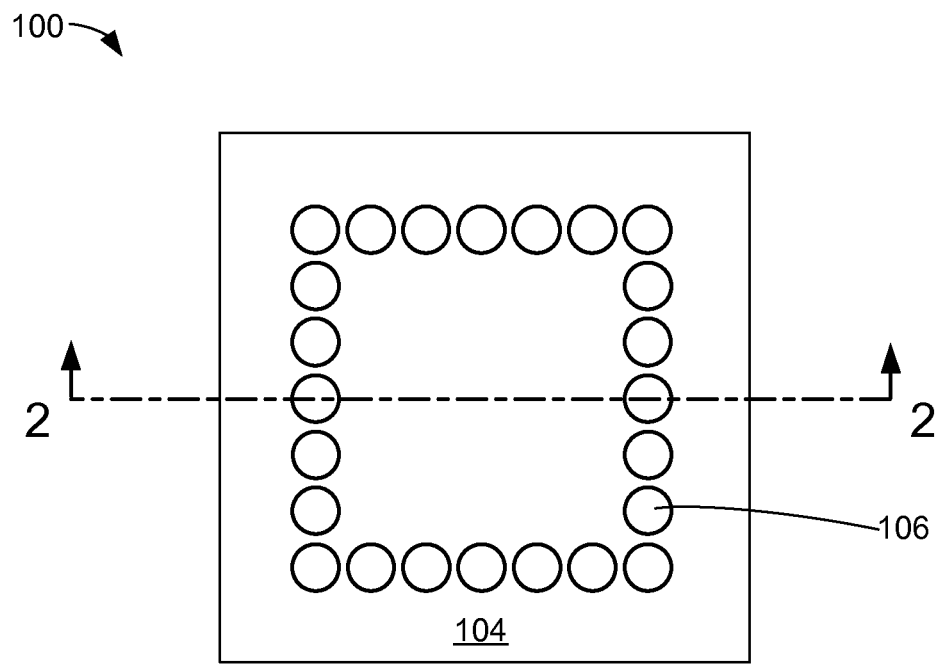
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. As a matter of descriptive convenience and are not intended to have any other significance or provide limitations for the present invention.

For expository purposes, the term "horizontal" as used herein is defined as a plane parallel to the plane or surface of the active side of an integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The terms "top", "bottom", "upper", and "lower" are terms of convenience and not absolute. At different stages of processing, a "top" element may in fact be turned upside-down such that it is facing downwards. Similarly, a "bottom" element may in fact be turned upside-down such that it is facing upwards.

Referring now to FIG. 1, therein is shown a top view of an integrated circuit packaging system 100 in a first embodiment of the present invention. The top view depicts the integrated circuit packaging system 100 having a top encapsulation 104.

The top encapsulation 104 is defined as a protective cover for the integrated circuit packaging system 100, hermetically sealing the contents within the top encapsulation. For example, the top encapsulation 104 can be a molding compound or an epoxy compound. The top encapsulation 104 can include top vias 106. The top vias 106 are defined as partial apertures through the top encapsulation 104 to expose an element encapsulated within the top encapsulation 104 and the partial apertures filled with a conductive material. The top encapsulation 104 can have characteristics of having been formed with a laser, including burn marks, melt marks, carbon residues, or a combination thereof on a surface of the top encapsulation 104 abutting the top vias 106.

Figure 2:
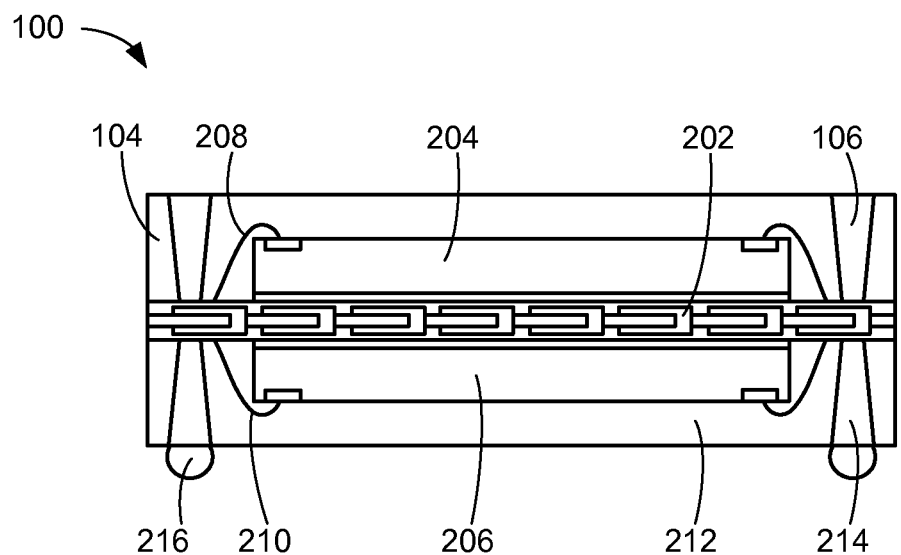
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The integrated circuit packaging system 100 can include a substrate 202. The substrate 202 is defined as a chip carrier. For example, the substrate 202 can be a laminated substrate or a ceramic substrate. The substrate 202 can be a chip carrier that is not entirely conductive, such as a laminated substrate or a ceramic substrate.

The integrated circuit packaging system 100 can also include a top integrated circuit 204 and a bottom integrated circuit 206 each mounted on different sides of the substrate 202. The top integrated circuit 204 and the bottom integrated circuit 206 can be each attached to the different sides of the substrate 202. The top integrated circuit 204 is defined as a device with active circuitry thereon. For example, the top integrated circuit 204 can be an unpackaged die or a packaged electronic module. The bottom integrated circuit 206 is defined as another device with active circuitry thereon. For example, the bottom integrated circuit 206 can be an unpackaged die or a packaged electronic module.

The integrated circuit packaging system 100 can include top interconnects 208. The top interconnects 208 are defined as conductive structures for electrically connecting one electronic component to another. The top interconnects 208 can be attached to and between the substrate 202 and the top integrated circuit 204. The top interconnects 208 can be, for example, bond wires, ribbon bond wires, solder balls, conductive bumps, or other conductive structures.

The integrated circuit packaging system 100 can include bottom interconnects 210. The bottom interconnects 210 are defined as conductive structures for electrically connecting one electronic component to another. The bottom interconnects 210 can be attached to and between the substrate 202 and the bottom integrated circuit 206. The bottom interconnects 210 can be, for example, wires, conductive bumps, ribbon bond wires, solder balls, or other conductive structures.

The integrated circuit packaging system 100 can include the top encapsulation 104. The top encapsulation 104 can encapsulate the top integrated circuit 204. The top encapsulation 104 can also encapsulate the top interconnects 208.

The top encapsulation 104 can include the top vias 106. The top vias 106 can be formed through the top encapsulation 104 to be electrically connected to the substrate 202. The top vias 106 can have a truncated conic shape. The top vias 106 can have a smaller surface area on a first surface where it is in direct contact with the substrate 202 compared to a second surface exposed from the top encapsulation 104. The top vias 106 can have finer pitches and smaller dimensions than embedded solder balls or conductive vertical columns due to its truncated conic shape. Further, because the top vias 106 can be formed with a laser drill, the top vias 106 can be made to be much smaller than other conductive structures formed prior to encapsulation.

It has been discovered that the use of the top vias 106 having a truncated conic shape formed through the top encapsulation 104 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the top vias 106 having a truncated conic shape formed through the top encapsulation 104 to the substrate 202 can leave room within the packages for attaching extra items while avoiding the precision equipment.

The integrated circuit packaging system 100 can include a bottom encapsulation 212. The bottom encapsulation 212 is defined as a protective cover for the integrated circuit packaging system 100, hermetically sealing the contents within the bottom encapsulation.

For example, the bottom encapsulation 212 can be a molding compound or an epoxy compound. The bottom encapsulation 212 can encapsulate the bottom integrated circuit 206.

The bottom encapsulation 212 can also encapsulate the bottom interconnects 210. The bottom encapsulation 212 can be formed simultaneously with the top encapsulation 104, such as with the same encapsulant or the same molding compound using a dual side mold. The bottom encapsulation 212 can have characteristics of having been formed with the top encapsulation 104 simultaneously, such as having reduced warpage, symmetrical warpage, or same cured encapsulant pattern.

The bottom encapsulation 212 can include bottom vias 214. The bottom vias 214 are defined as partial apertures through the bottom encapsulation 212 to expose an element encapsulated within the bottom encapsulation 212, the partial apertures filled with a conductive material. The bottom encapsulation 212 can have characteristics of having been formed with a laser, including burn marks, melt marks, carbon residues, or a combination thereof on a surface of the bottom encapsulation 212 abutting the bottom vias 214. The bottom vias 214 can be formed through the bottom encapsulation 212 to be electrically connected to the substrate 202.

The bottom vias 214 can have a truncated conic shape. The bottom vias 214 can have a smaller surface area on a first surface where it is in direct contact with the substrate 202 compared to a second surface exposed from the bottom encapsulation 212. The bottom vias 214 can have finer pitches and smaller dimensions than embedded solder balls or conductive vertical columns due to its truncated conic shape. Further, because the bottom vias 214 can be formed with a laser drill, the bottom vias 214 can be made to be much smaller than other conductive structures formed prior to encapsulation.

It has been unexpectedly found that the use of the bottom vias 214 having a truncated conic shape formed through the bottom encapsulation 212 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the bottom vias 214 having a truncated conic shape formed through the bottom encapsulation 212 to the substrate 202 can leave room within the packages for attaching extra items while avoiding the precision equipment.

It has also been unexpectedly found that forming the bottom vias 214 after forming the bottom encapsulation 212 allows for finer pitch contacts at the substrate 202. Precise placement of conductive structures on the substrate 202 can be difficult. However, drilling of the bottom encapsulation 212 can be made with a finer pitch using technologies such as lasers or mechanical drills after the bottom encapsulation 212 is formed. Accordingly, forming the bottom vias 214 after forming the bottom encapsulation 212 allows for finer pitch contacts at the substrate 202.

The integrated circuit packaging system 100 can include first external interconnects 216. The first external interconnects 216 are defined as conductive structures mounted over the bottom encapsulation 212 for electrically connecting the integrated circuit packaging system 100 with outside devices, packages, or components. The first external interconnects 216 can be, for example, solder balls, conductive bumps, or conductive bonds. The first external interconnects 216 can be attached to the bottom vias 214.

It has been discovered that the integrated circuit packaging system 100 having the top encapsulation 104, the bottom encapsulation 212, and the top vias 106 or the bottom vias 214 on the substrate 202 provides the present invention with reduced package profile and finer pitch. The integrated circuit packaging system 100 requires only the substrate 202 to mount two integrated circuits on each side of the substrate 202. The top vias 106 or the bottom vias 214 provide electrical access to the substrate 202 and the integrated circuits without additional connector spacing. Accordingly, the top encapsulation 104 and the bottom encapsulation 212 having the top vias 106 or the bottom vias 214 on the substrate 202 provide the present invention with reduced package profile and finer pitch.

It has further been discovered that the integrated circuit packaging system 100 having both the top encapsulation 104 and the bottom encapsulation 212 formed simultaneously over the substrate 202 provides the present invention with reduced package warpage. The top encapsulation 104 and the bottom encapsulation 212 on each side of the substrate 202 balance the rates of expansion of the package components and thus can minimize package warpage. Accordingly, the top encapsulation 104 and the bottom encapsulation 212 formed simultaneously provide the present invention with reduced package warpage.

Figure 3:
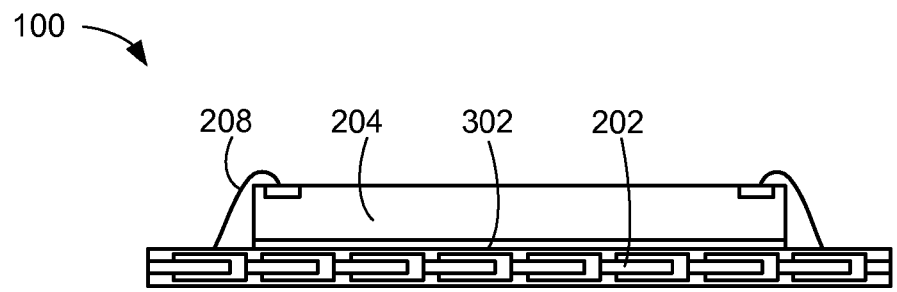
FIG. 3 is a cross-sectional view of the integrated circuit packaging system of FIG. 1 in a top integrated circuit attachment stage of manufacturing of the integrated circuit packaging system.

Referring now to FIG. 3, therein is shown a cross-sectional view of the integrated circuit packaging system 100 of FIG. 1 in a top integrated circuit attachment stage of manufacturing of the integrated circuit packaging system 100. The top integrated circuit 204 can be mounted on the substrate 202 on a first side 302 of the substrate 202. The top interconnects 208 can be directly connected to the substrate 202 and the top integrated circuit 204.

Figure 4:
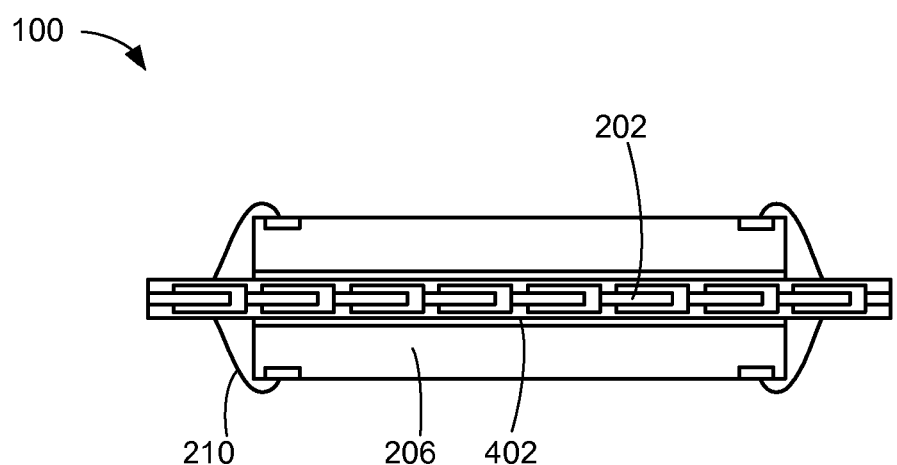
FIG. 4 is a cross-sectional view of the integrated circuit packaging system of FIG. 1 in a bottom integrated circuit attachment stage of manufacturing of the integrated circuit packaging system.

Referring now to FIG. 4, therein is shown a cross-sectional view of the integrated circuit packaging system 100 of FIG. 1 in a bottom integrated circuit attachment stage of manufacturing of the integrated circuit packaging system 100. The bottom integrated circuit 206 can be mounted on the substrate 202 on a second side 402 of the substrate 202. The bottom interconnects 210 can be directly connected to the substrate 202 and the bottom integrated circuit 206.

Figure 5:
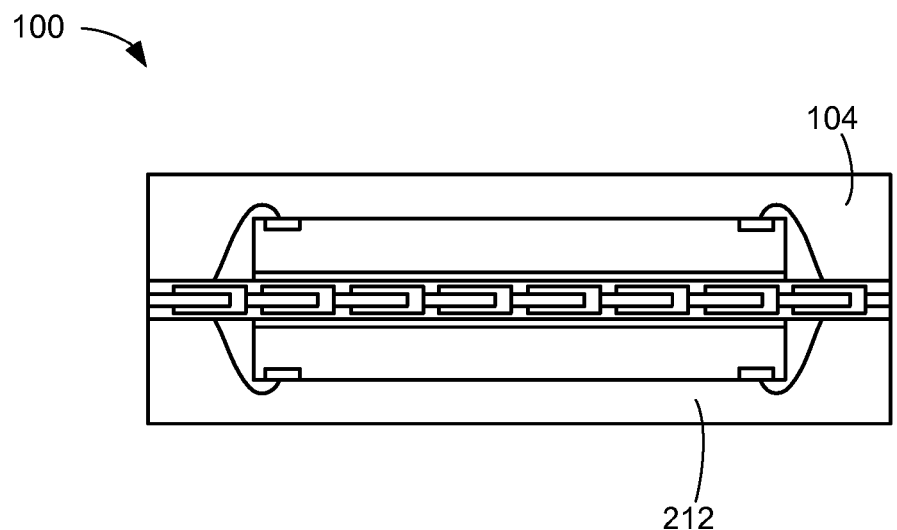
FIG. 5 is a cross-sectional view of the integrated circuit packaging system of FIG. 1 in a dual side molding stage of manufacturing of the integrated circuit packaging system.

Referring now to FIG. 5, therein is shown a cross-sectional view of the integrated circuit packaging system 100 of FIG. 1 in a dual side molding stage of manufacturing of the integrated circuit packaging system 100. The top encapsulation 104 can be formed in this stage of manufacturing. The bottom encapsulation 212 can be formed in this stage of manufacturing. The top encapsulation 104 and the bottom encapsulation 212 can be formed simultaneously in this stage of manufacturing by a dual sided mold.

Figure 6:
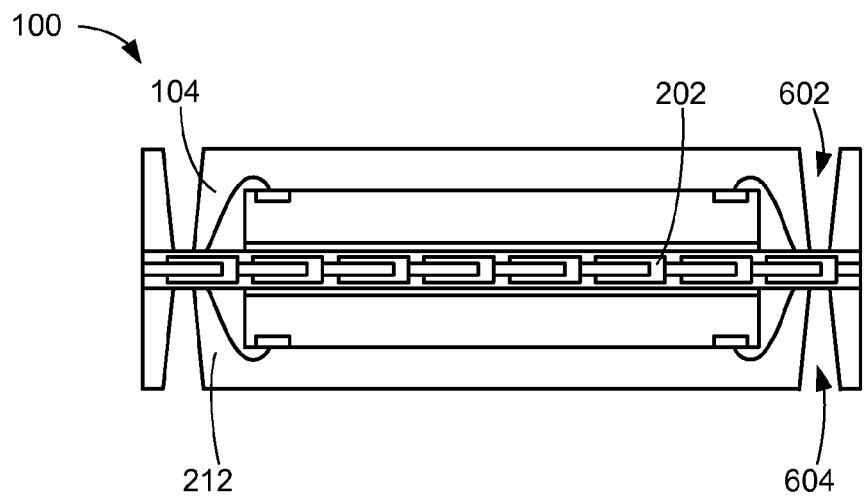
FIG. 6 is a cross-sectional view of the integrated circuit packaging system of FIG. 1 in a hole formation stage of manufacturing of the integrated circuit packaging system.

Referring now to FIG. 6, therein is shown a cross-sectional view of the integrated circuit packaging system 100 of FIG. 1 in a hole formation stage of manufacturing of the integrated circuit packaging system 100. Top holes 602 can be formed through the top encapsulation 104 exposing the substrate 202. Bottom holes 604 can be formed through the bottom encapsulation 212 exposing the substrate 202.

The top holes 602 can be formed by drilling, etching, lasering, or by removing a mold chase. The bottom holes 604 can be formed by drilling, etching, lasering, or by removing a mold chase. The top holes 602 can be formed on a peripheral extent of the top encapsulation 104. The bottom holes 604 can be formed on a peripheral extent of the bottom encapsulation 212.

The top encapsulation 104 can have characteristics of having been formed with a laser, including burn marks, melt marks, carbon residues, or a combination thereof on a surface or surfaces bounding the top holes 602. The bottom encapsulation 212 can have characteristics of having been formed with a laser, including burn marks, melt marks, carbon residues, or a combination thereof on a surface or surfaces bounding the bottom holes 604.

Figure 7:
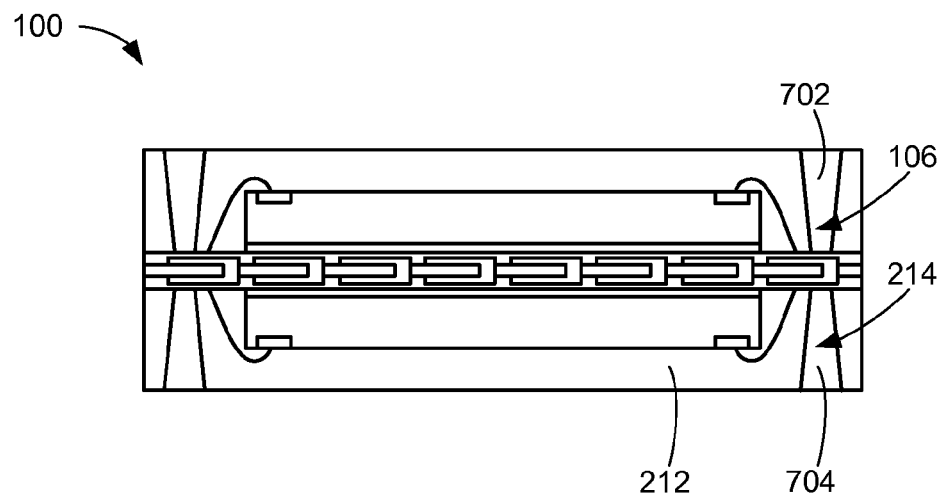
FIG. 7 is a cross-sectional view of the integrated circuit packaging system of FIG. 1 in a conductive element filling stage of manufacturing of the integrated circuit packaging system.

Referring now to FIG. 7, therein is shown a cross-sectional view of the integrated circuit packaging system 100 of FIG. 1 in a conductive element filling stage of manufacturing of the integrated circuit packaging system 100. The top holes 602 of FIG. 6 can be filled with a top filler 702 to form the top vias 106. The bottom holes 604 of FIG. 6 can be filled with a bottom filler 704 to form the bottom vias 214.

The top filler 702 can be, for example, solder paste, metal plating material, alloy, or semiconductor. The bottom filler 704 can be, for example, solder paste, metal plating material, alloy, or semiconductor. The top filler 702 and the bottom filler 704 can be made of the same or different materials. After the conductive element filling stage of manufacturing, the first external interconnects 216 of FIG. 2 can be attached over the bottom encapsulation 212 to form the integrated circuit packaging system 100.

Figure 8:
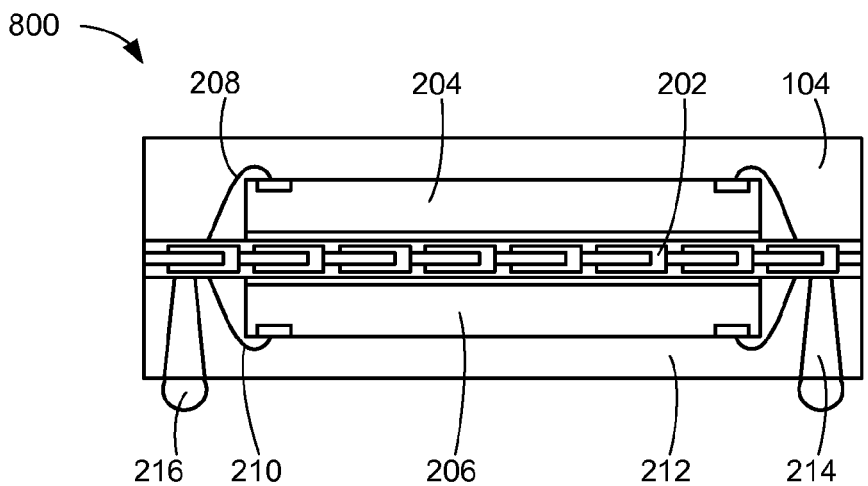
FIG. 8 is a cross-sectional view of an integrated circuit packaging system as exemplified by the top view of FIG. 1 along line 2-2 of FIG. 1 in a second embodiment of the present invention.

Referring now to FIG. 8, therein is shown a cross-sectional view of an integrated circuit packaging system 800 as exemplified by the top view of FIG. 1 along line 2-2 of FIG. 1 in a second embodiment of the present invention. The integrated circuit packaging system 800 can include the substrate 202.

The integrated circuit packaging system 800 can also include the top integrated circuit 204 and the bottom integrated circuit 206 each mounted on different sides of the substrate 202. The top integrated circuit 204 and the bottom integrated circuit 206 can be each attached to the different sides of the substrate 202. The integrated circuit packaging system 800 can include the top interconnects 208.

The top interconnects 208 can be attached to and between the substrate 202 and the top integrated circuit 204. The top interconnects 208 can be, for example, wires, ribbon bond wires, conductive bumps, solder balls, or other conductive structures.

The integrated circuit packaging system 800 can include the bottom interconnects 210. The bottom interconnects 210 can be attached to and between the substrate 202 and the bottom integrated circuit 206. The bottom interconnects 210 can be, for example, wires, ribbon bond wires, conductive bumps, solder balls, or other conductive structures.

The integrated circuit packaging system 800 can include the top encapsulation 104. The top encapsulation 104 can encapsulate the top integrated circuit 204. The top encapsulation 104 can also encapsulate the top interconnects 208.

The integrated circuit packaging system 800 can include the bottom encapsulation 212. The bottom encapsulation 212 can encapsulate the bottom integrated circuit 206. The bottom encapsulation 212 can also encapsulate the bottom interconnects 210. The bottom encapsulation 212 can be formed simultaneously with the top encapsulation 104, such as with the same encapsulant or the same molding compound using a dual side mold. The bottom encapsulation 212 can have characteristics of having been formed with the top encapsulation 104 simultaneously, such as having reduced warpage, symmetrical warpage, or same cured encapsulant pattern.

The bottom encapsulation 212 can include the bottom vias 214. The bottom encapsulation 212 can have characteristics of having been formed with a laser, including burn marks, melt marks, carbon residues, or a combination thereof on a surface of the bottom encapsulation 212 abutting the bottom vias 214. The bottom vias 214 can be formed through the bottom encapsulation 212 to be electrically connected to the substrate 202.

The bottom vias 214 can be formed through the bottom encapsulation 212 to be electrically connected to the substrate 202. The bottom vias 214 can have a truncated conic shape. The bottom vias 214 can have a smaller surface area on a first surface where it is in direct contact with the substrate 202 compared to a second surface exposed from the bottom encapsulation 212. The bottom vias 214 can have finer pitches and smaller dimensions than embedded solder balls or conductive vertical columns due to its truncated conic shape. Further, because the bottom vias 214 can be formed with a laser drill, the bottom vias 214 can be made to be much smaller than other conductive structures formed prior to encapsulation.

It has been unexpectedly found that the use of the bottom vias 214 having a truncated conic shape formed through the bottom encapsulation 212 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the bottom vias 214 having a truncated conic shape formed through the bottom encapsulation 212 to the substrate 202 can leave room within the packages for attaching extra items while avoiding the precision equipment.

It has also been unexpectedly found that forming the bottom vias 214 after forming the bottom encapsulation 212 allows for finer pitch contacts at the substrate 202. Precise placement of conductive structures on the substrate 202 can be difficult. However, drilling of the bottom encapsulation 212 can be made with a finer pitch using technologies such as lasers or mechanical drills after the bottom encapsulation 212 is formed. Accordingly, forming the bottom vias 214 after forming the bottom encapsulation 212 allows for finer pitch contacts at the substrate 202.

The integrated circuit packaging system 800 can include the first external interconnects 216. The first external interconnects 216 can be, for example, solder balls, conductive bumps, or conductive bonds. The first external interconnects 216 can be attached to the bottom vias 214.

It has been discovered that the integrated circuit packaging system 800 having the top encapsulation 104, the bottom encapsulation 212, and the bottom vias 214 on the substrate 202 provides the present invention with reduced package profile and finer pitch. The integrated circuit packaging system 800 requires only the substrate 202 to mount two integrated circuits on each side of the substrate 202. The bottom vias 214 provide electrical access to the substrate 202 and the integrated circuits without additional connector spacing. Accordingly, the top encapsulation 104 and the bottom encapsulation 212 having the bottom vias 214 on the substrate 202 provide the present invention with reduced package profile and finer pitch.

It has further been discovered that the integrated circuit packaging system 800 having both the top encapsulation 104 and the bottom encapsulation 212 formed simultaneously over the substrate 202 provides the present invention with reduced package warpage. The top encapsulation 104 and the bottom encapsulation 212 on each side of the substrate 202 balance the rates of expansion of the package components and thus can minimize package warpage. Accordingly, the top encapsulation 104 and the bottom encapsulation 212 formed simultaneously provide the present invention with reduced package warpage.

Figure 9:
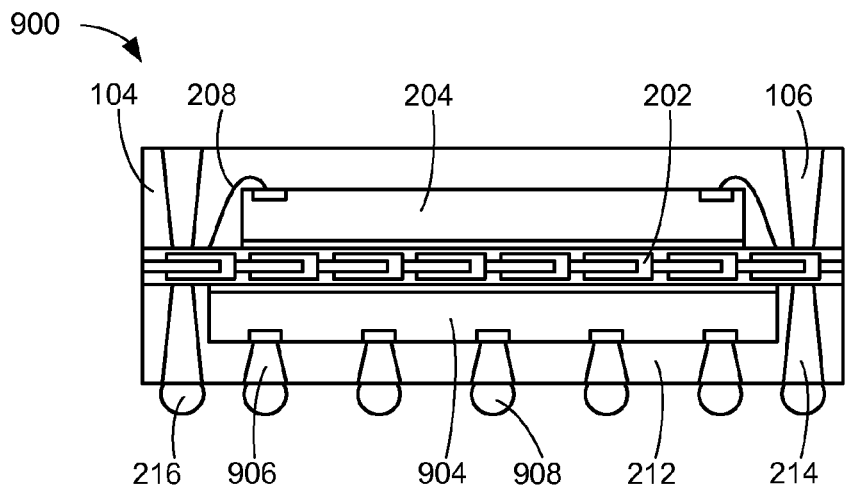
FIG. 9 is a cross-sectional view of an integrated circuit packaging system as exemplified by the top view of FIG. 1 along line 2-2 of FIG. 1 in a third embodiment of the present invention.

Referring now to FIG. 9, therein is shown a cross-sectional view of an integrated circuit packaging system 900 as exemplified by the top view of FIG. 1 along line 2-2 of FIG. 1 in a third embodiment of the present invention. The integrated circuit packaging system 900 can include the substrate 202.

The integrated circuit packaging system 900 can also include the top integrated circuit 204 and a bottom integrated circuit 904 each mounted on different sides of the substrate 202. The bottom integrated circuit 904 is defined as a device with active circuitry thereon. For example, the bottom integrated circuit 904 can be an unpackaged die, a packaged electronic module, a wire bonded die, or a flip chip die.

The top integrated circuit 204 and the bottom integrated circuit 904 can be each attached to the different sides of the substrate 202. The integrated circuit packaging system 900 can include the top interconnects 208.

The top interconnects 208 can be attached to and between the substrate 202 and the top integrated circuit 204. The top interconnects 208 can be, for example, wires, ribbon bond wires, conductive bumps, solder balls, or other conductive structures.

The integrated circuit packaging system 900 can include the top encapsulation 104. The top encapsulation 104 can encapsulate the top integrated circuit 204. The top encapsulation 104 can also encapsulate the top interconnects 208.

The top encapsulation 104 can include the top vias 106. The top encapsulation 104 can have characteristics of having been formed with a laser, including burn marks, melt marks, carbon residues, or a combination thereof on a surface of the top encapsulation 104 abutting the top vias 106.

The top vias 106 can be formed through the top encapsulation 104 to be electrically connected to the substrate 202. The top vias 106 can have a truncated conic shape. The top vias 106 can have a smaller surface area on a first surface where it is in direct contact with the substrate 202 compared to a second surface exposed from the top encapsulation 104. The top vias 106 can have finer pitches and smaller dimensions than embedded solder balls or conductive vertical columns due to its truncated conic shape. Further, because the top vias 106 can be formed with a laser drill, the top vias 106 can be made to be much smaller than other conductive structures formed prior to encapsulation.

It has been discovered that the use of the top vias 106 having a truncated conic shape formed through the top encapsulation 104 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the top vias 106 having a truncated conic shape formed through the top encapsulation 104 to the substrate 202 can leave room within the packages for attaching extra items while avoiding the precision equipment.

The integrated circuit packaging system 900 can include the bottom encapsulation 212. The bottom encapsulation 212 can encapsulate the bottom integrated circuit 904. The bottom encapsulation 212 can be formed simultaneously with the top encapsulation 104, such as with the same encapsulant or the same molding compound using a dual side mold. The bottom encapsulation 212 can have characteristics of having been formed with the top encapsulation 104 simultaneously, such as having reduced warpage, symmetrical warpage, or same cured encapsulant pattern.

The bottom encapsulation 212 can include the bottom vias 214. The bottom encapsulation 212 can have characteristics of having been formed with a laser, including burn marks, melt marks, carbon residues, or a combination thereof on a surface of the bottom encapsulation 212 abutting the bottom vias 214. The bottom vias 214 can be formed through the bottom encapsulation 212 to be electrically connected to the substrate 202.

The bottom vias 214 can have a truncated conic shape. The bottom vias 214 can have a smaller surface area on a first surface where it is in direct contact with the substrate 202 compared to a second surface exposed from the bottom encapsulation 212. The bottom vias 214 can have finer pitches and smaller dimensions than embedded solder balls or conductive vertical columns due to its truncated conic shape. Further, because the bottom vias 214 can be formed with a laser drill, the bottom vias 214 can be made to be much smaller than other conductive structures formed prior to encapsulation.

It has been unexpectedly found that the use of the bottom vias 214 having a truncated conic shape formed through the bottom encapsulation 212 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the bottom vias 214 having a truncated conic shape formed through the bottom encapsulation 212 to the substrate 202 can leave room within the packages for attaching extra items while avoiding the precision equipment.

It has also been unexpectedly found that forming the bottom vias 214 after forming the bottom encapsulation 212 allows for finer pitch contacts at the substrate 202. Precise placement of conductive structures on the substrate 202 can be difficult. However, drilling of the bottom encapsulation 212 can be made with a finer pitch using technologies such as lasers or mechanical drills after the bottom encapsulation 212 is formed. Accordingly, forming the bottom vias 214 after forming the bottom encapsulation 212 allows for finer pitch contacts at the substrate 202.

The bottom encapsulation 212 can include first vias 906. The first vias 906 are defined as partial apertures through the bottom encapsulation 212 to expose an element encapsulated within the bottom encapsulation 212, the partial apertures filled with a conductive material. The first vias 906 can be formed through the bottom encapsulation 212 to be electrically connected to the bottom integrated circuit 904.

The integrated circuit packaging system 900 can include the first external interconnects 216. The first external interconnects 216 can be, for example, solder balls, conductive bumps, or conductive bonds. The first external interconnects 216 can be attached to the bottom vias 214.

The integrated circuit packaging system 900 can include second external interconnects 908. The second external interconnects 908 are defined as conductive structures mounted over the bottom encapsulation 212. The second external interconnects 908 can be for electrically connecting the bottom integrated circuit 904 of the integrated circuit packaging system 900 with outside devices, packages, or components. The second external interconnects 908 can be, for example, solder balls, conductive bumps, or conductive bonds. The second external interconnects 908 can be mounted on the first vias 906. The second external interconnects 908 can be attached to the first vias 906.

It has been discovered that the integrated circuit packaging system 900 having the top encapsulation 104, the bottom encapsulation 212, and the top vias 106 or the bottom vias 214 on the substrate 202 provides the present invention with reduced package profile and finer pitch. The integrated circuit packaging system 900 requires only the substrate 202 to mount two integrated circuits on each side of the substrate 202. The top vias 106 or the bottom vias 214 provide electrical access to the substrate 202 and the integrated circuits without additional connector spacing. Accordingly, the top encapsulation 104 and the bottom encapsulation 212 having the top vias 106 or the bottom vias 214 on the substrate 202 provide the present invention with reduced package profile and finer pitch.

It has further been discovered that the integrated circuit packaging system 900 having both the top encapsulation 104 and the bottom encapsulation 212 formed simultaneously over the substrate 202 provides the present invention with reduced package warpage. The top encapsulation 104 and the bottom encapsulation 212 on each side of the substrate 202 balance the rates of expansion of the package components and thus can minimize package warpage. Accordingly, the top encapsulation 104 and the bottom encapsulation 212 formed simultaneously provide the present invention with reduced package warpage.

Figure 10:
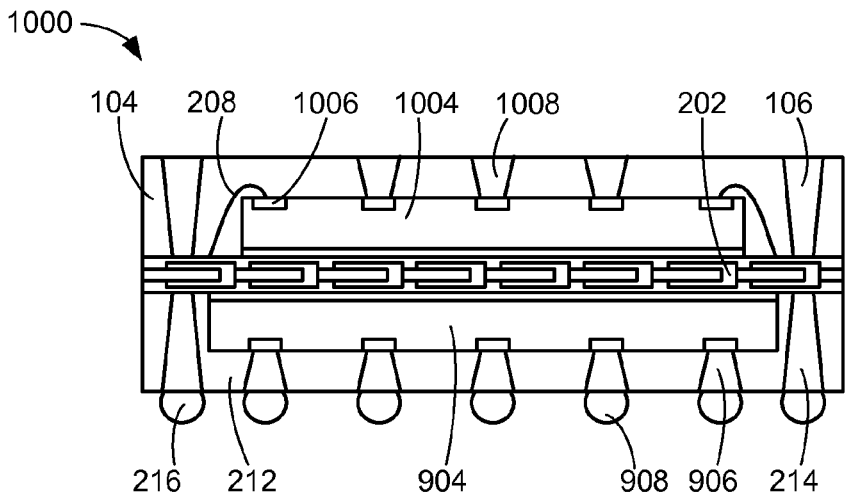
FIG. 10 is a cross-sectional view of an integrated circuit packaging system as exemplified by the top view of FIG. 1 along line 2-2 of FIG. 1 in a fourth embodiment of the present invention.

Referring now to FIG. 10, therein is shown a cross-sectional view of an integrated circuit packaging system 1000 as exemplified by the top view of FIG. 1 along line 2-2 of FIG. 1 in a fourth embodiment of the present invention. The integrated circuit packaging system 1000 can include the substrate 202.

The integrated circuit packaging system 1000 can also include a top integrated circuit 1004 and the bottom integrated circuit 904 each mounted on different sides of the substrate 202. The top integrated circuit 1004 and the bottom integrated circuit 904 can be each attached to the different sides of the substrate 202. The integrated circuit packaging system 1000 can include the top interconnects 208.

The top interconnects 208 can be attached to and between the substrate 202 and the top integrated circuit 1004. The top interconnects 208 can be, for example, wires, ribbon bond wires, conductive bumps, solder balls, or other conductive structures.

The top integrated circuit 1004 can include a top redistribution layer 1006. The top redistribution layer 1006 is defined as a conductive layer on top of the top integrated circuit 1004 that channels electrical power or signal amongst terminals of the top integrated circuit 1004. The top redistribution layer 1006 can be placed at a surface of the top integrated circuit 1004 away from the substrate 202. The top redistribution layer 1006 can be placed by a number of processes, such as plating, sputtering, or vapor deposition.

The integrated circuit packaging system 1000 can include the top encapsulation 104. The top encapsulation 104 can encapsulate the top integrated circuit 1004. The top encapsulation 104 can also encapsulate the top interconnects 208.

The top encapsulation 104 can include the top vias 106. The top encapsulation 104 can have characteristics of having been formed with a laser, including burn marks, melt marks, carbon residues, or a combination thereof on a surface of the top encapsulation 104 abutting the top vias 106.

The top vias 106 can be formed through the top encapsulation 104 to be electrically connected to the substrate 202. The top vias 106 can have a truncated conic shape. The top vias 106 can have a smaller surface area on a first surface where it is in direct contact with the substrate 202 compared to a second surface exposed from the top encapsulation 104. The top vias 106 can have finer pitches and smaller dimensions than embedded solder balls or conductive vertical columns due to its truncated conic shape. Further, because the top vias 106 can be formed with a laser drill, the top vias 106 can be made to be much smaller than other conductive structures formed prior to encapsulation.

It has been discovered that the use of the top vias 106 having a truncated conic shape formed through the top encapsulation 104 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the top vias 106 having a truncated conic shape formed through the top encapsulation 104 to the substrate 202 can leave room within the packages for attaching extra items while avoiding the precision equipment.

The top encapsulation 104 can include second vias 1008. The second vias 1008 are defined as partial apertures through the top encapsulation 104 to expose an element encapsulated within the top encapsulation 104, the partial apertures filled with conductive material. The second vias 1008 can be formed through the top encapsulation 104 to be electrically connected to the top integrated circuit 1004. The second vias 1008 can be electrically connected to the top redistribution layer 1006 of the top integrated circuit 1004.

The integrated circuit packaging system 1000 can include the bottom encapsulation 212. The bottom encapsulation 212 can encapsulate the bottom integrated circuit 904. The bottom encapsulation 212 can be formed simultaneously with the top encapsulation 104, such as with the same encapsulant or the same molding compound using a dual side mold. The bottom encapsulation 212 can have characteristics of having been formed with the top encapsulation 104 simultaneously, such as having reduced warpage, symmetrical warpage, or same cured encapsulant pattern.

The bottom encapsulation 212 can include the bottom vias 214. The bottom encapsulation 212 can have characteristics of having been formed with a laser, including burn marks, melt marks, carbon residues, or a combination thereof on a surface of the bottom encapsulation 212 abutting the bottom vias 214. The bottom vias 214 can be formed through the bottom encapsulation 212 to be electrically connected to the substrate 202.

The bottom vias 214 can have a truncated conic shape. The bottom vias 214 can have a smaller surface area on a first surface where it is in direct contact with the substrate 202 compared to a second surface exposed from the bottom encapsulation 212. The bottom vias 214 can have finer pitches and smaller dimensions than embedded solder balls or conductive vertical columns due to its truncated conic shape. Further, because the bottom vias 214 can be formed with a laser drill, the bottom vias 214 can be made to be much smaller than other conductive structures formed prior to encapsulation.

It has been unexpectedly found that the use of the bottom vias 214 having a truncated conic shape formed through the bottom encapsulation 212 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the bottom vias 214 having a truncated conic shape formed through the bottom encapsulation 212 to the substrate 202 can leave room within the packages for attaching extra items while avoiding the precision equipment.

It has also been unexpectedly found that forming the bottom vias 214 after forming the bottom encapsulation 212 allows for finer pitch contacts at the substrate 202. Precise placement of conductive structures on the substrate 202 can be difficult. However, drilling of the bottom encapsulation 212 can be made with a finer pitch using technologies such as lasers or mechanical drills after the bottom encapsulation 212 is formed. Accordingly, forming the bottom vias 214 after forming the bottom encapsulation 212 allows for finer pitch contacts at the substrate 202.

The bottom encapsulation 212 can include the first vias 906. The first vias 906 can be formed through the bottom encapsulation 212 to be electrically connected to the bottom integrated circuit 904.

The integrated circuit packaging system 1000 can include the first external interconnects 216. The first external interconnects 216 can be, for example, solder balls, conductive bumps, or conductive bonds. The first external interconnects 216 can be attached to the bottom vias 214.

The integrated circuit packaging system 1000 can include the second external interconnects 908. The second external interconnects 908 can be for electrically connecting the bottom integrated circuit 904 of the integrated circuit packaging system 1000 with outside devices, packages, or components. The second external interconnects 908 can be, for example, solder balls, conductive bumps, or conductive bonds. The second external interconnects 908 can be mounted on the first vias 906. The second external interconnects 908 can be attached to the first vias 906.

It has been discovered that the integrated circuit packaging system 1000 having the top encapsulation 104, the bottom encapsulation 212, and the top vias 106 or the bottom vias 214 on the substrate 202 provides the present invention with reduced package profile and finer pitch. The integrated circuit packaging system 1000 requires only the substrate 202 to mount two integrated circuits on each side of the substrate 202. The top vias 106 or the bottom vias 214 provide electrical access to the substrate 202 and the integrated circuits without additional connector spacing. Accordingly, the top encapsulation 104 and the bottom encapsulation 212 having the top vias 106 or the bottom vias 214 on the substrate 202 provide the present invention with reduced package profile and finer pitch.

It has further been discovered that the integrated circuit packaging system 1000 having both the top encapsulation 104 and the bottom encapsulation 212 formed simultaneously over the substrate 202 provides the present invention with reduced package warpage. The top encapsulation 104 and the bottom encapsulation 212 on each side of the substrate 202 balance the rates of expansion of the package components and thus can minimize package warpage. Accordingly, the top encapsulation 104 and the bottom encapsulation 212 formed simultaneously provide the present invention with reduced package warpage.

Figure 11:
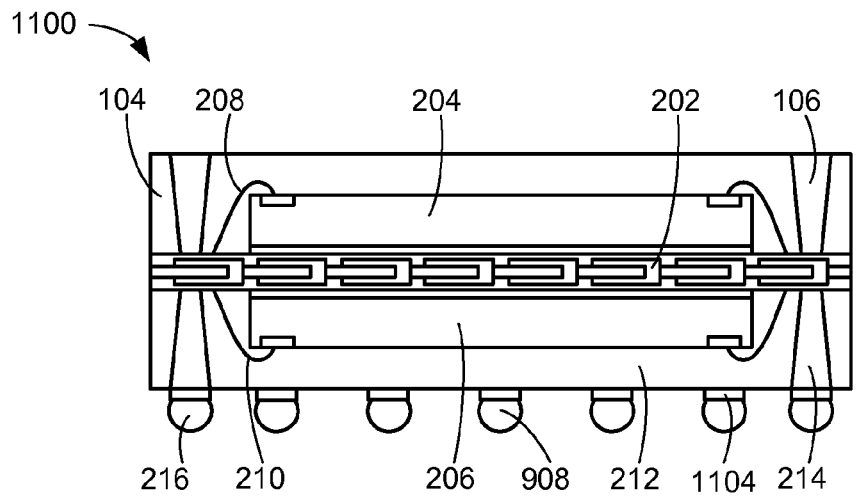
FIG. 11 is a cross-sectional view of an integrated circuit packaging system as exemplified by the top view of FIG. 1 along line 2-2 of FIG. 1 in a fifth embodiment of the present invention.

Referring now to FIG. 11, therein is shown a cross-sectional view of an integrated circuit packaging system 1100 as exemplified by the top view of FIG. 1 along line 2-2 of FIG. 1 in a fifth embodiment of the present invention. The integrated circuit packaging system 1100 can include the substrate 202.

The integrated circuit packaging system 1100 can also include the top integrated circuit 204 and the bottom integrated circuit 206 each mounted on different sides of the substrate 202. The top integrated circuit 204 and the bottom integrated circuit 206 can be each attached to the different sides of the substrate 202. The integrated circuit packaging system 1100 can include the top interconnects 208.

The top interconnects 208 can be attached to and between the substrate 202 and the top integrated circuit 204. The top interconnects 208 can be, for example, wires, ribbon bond wires, conductive bumps, solder balls, or other conductive structures.

The integrated circuit packaging system 1100 can include the bottom interconnects 210. The bottom interconnects 210 can be attached to and between the substrate 202 and the bottom integrated circuit 206. The bottom interconnects 210 can be, for example, wires, ribbon bond wires, conductive bumps, solder balls, or other conductive structures.

The integrated circuit packaging system 1100 can include the top encapsulation 104. The top encapsulation 104 can encapsulate the top integrated circuit 204. The top encapsulation 104 can also encapsulate the top interconnects 208.

The top encapsulation 104 can include the top vias 106. The top encapsulation 104 can have characteristics of having been formed with a laser, including burn marks, melt marks, carbon residues, or a combination thereof on a surface of the top encapsulation 104 abutting the top vias 106.

The top vias 106 can be formed through the top encapsulation 104 to be electrically connected to the substrate 202. The top vias 106 can have a truncated conic shape. The top vias 106 can have a smaller surface area on a first surface where it is in direct contact with the substrate 202 compared to a second surface exposed from the top encapsulation 104. The top vias 106 can have finer pitches and smaller dimensions than embedded solder balls or conductive vertical columns due to its truncated conic shape. Further, because the top vias 106 can be formed with a laser drill, the top vias 106 can be made to be much smaller than other conductive structures formed prior to encapsulation.

It has been discovered that the use of the top vias 106 having a truncated conic shape formed through the top encapsulation 104 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the top vias 106 having a truncated conic shape formed through the top encapsulation 104 to the substrate 202 can leave room within the packages for attaching extra items while avoiding the precision equipment.

The integrated circuit packaging system 1100 can include the bottom encapsulation 212. The bottom encapsulation 212 can encapsulate the bottom integrated circuit 206. The bottom encapsulation 212 can also encapsulate the bottom interconnects 210. The bottom encapsulation 212 can be formed simultaneously with the top encapsulation 104, such as with the same encapsulant or the same molding compound using a dual side mold. The bottom encapsulation 212 can have characteristics of having been formed with the top encapsulation 104 simultaneously, such as having reduced warpage, symmetrical warpage, or same cured encapsulant pattern.

The bottom encapsulation 212 can include the bottom vias 214. The bottom encapsulation 212 can have characteristics of having been formed with a laser, including burn marks, melt marks, carbon residues, or a combination thereof on a surface of the bottom encapsulation 212 abutting the bottom vias 214. The bottom vias 214 can be formed through the bottom encapsulation 212 to be electrically connected to the substrate 202.

The bottom vias 214 can have a truncated conic shape. The bottom vias 214 can have a smaller surface area on a first surface where it is in direct contact with the substrate 202 compared to a second surface exposed from the bottom encapsulation 212. The bottom vias 214 can have finer pitches and smaller dimensions than embedded solder balls or conductive vertical columns due to its truncated conic shape. Further, because the bottom vias 214 can be formed with a laser drill, the bottom vias 214 can be made to be much smaller than other conductive structures formed prior to encapsulation.

It has been unexpectedly found that the use of the bottom vias 214 having a truncated conic shape formed through the bottom encapsulation 212 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the bottom vias 214 having a truncated conic shape formed through the bottom encapsulation 212 to the substrate 202 can leave room within the packages for attaching extra items while avoiding the precision equipment.

It has also been unexpectedly found that forming the bottom vias 214 after forming the bottom encapsulation 212 allows for finer pitch contacts at the substrate 202. Precise placement of conductive structures on the substrate 202 can be difficult. However, drilling of the bottom encapsulation 212 can be made with a finer pitch using technologies such as lasers or mechanical drills after the bottom encapsulation 212 is formed. Accordingly, forming the bottom vias 214 after forming the bottom encapsulation 212 allows for finer pitch contacts at the substrate 202.

The bottom encapsulation 212 can include a bottom redistribution layer 1104. The bottom redistribution layer 1104 can be placed at a surface of the bottom encapsulation 212 by a number of processes, such as plating, vapor deposition, or sputtering. The bottom redistribution layer 1104 is defined as a conductive layer at a surface the bottom encapsulation 212 that channels electrical power or signal amongst terminals of the integrated circuit packaging system 1100 on the bottom encapsulation 212. For example, the bottom redistribution layer 1104 can conduct an electric power or signal amongst the first external interconnects 216 and the second external interconnects 908.

The integrated circuit packaging system 1100 can include the second external interconnects 908. The second external interconnects 908 can be attached and electrically connected to the bottom redistribution layer 1104 of the integrated circuit packaging system 1100. The second external interconnects 908 can be, for example, solder balls, conductive bumps, or conductive bonds. The second external interconnects 908 can be mounted on the bottom redistribution layer 1104.

The integrated circuit packaging system 1100 can include the first external interconnects 216. The first external interconnects 216 can be, for example, solder balls, conductive bumps, or conductive bonds. The first external interconnects 216 can be attached to the bottom vias 214.

It has been discovered that the integrated circuit packaging system 1100 having the top encapsulation 104, the bottom encapsulation 212, and the top vias 106 or the bottom vias 214 on the substrate 202 provides the present invention with reduced package profile and finer pitch. The integrated circuit packaging system 1100 requires only the substrate 202 to mount two integrated circuits on each side of the substrate 202. The top vias 106 or the bottom vias 214 provide electrical access to the substrate 202 and the integrated circuits without additional connector spacing. Accordingly, the top encapsulation 104 and the bottom encapsulation 212 having the top vias 106 or the bottom vias 214 on the substrate 202 provide the present invention with reduced package profile and finer pitch.

It has further been discovered that the integrated circuit packaging system 1100 having both the top encapsulation 104 and the bottom encapsulation 212 formed simultaneously over the substrate 202 provides the present invention with reduced package warpage. The top encapsulation 104 and the bottom encapsulation 212 on each side of the substrate 202 balance the rates of expansion of the package components and thus can minimize package warpage. Accordingly, the top encapsulation 104 and the bottom encapsulation 212 formed simultaneously provide the present invention with reduced package warpage.

Figure 12:
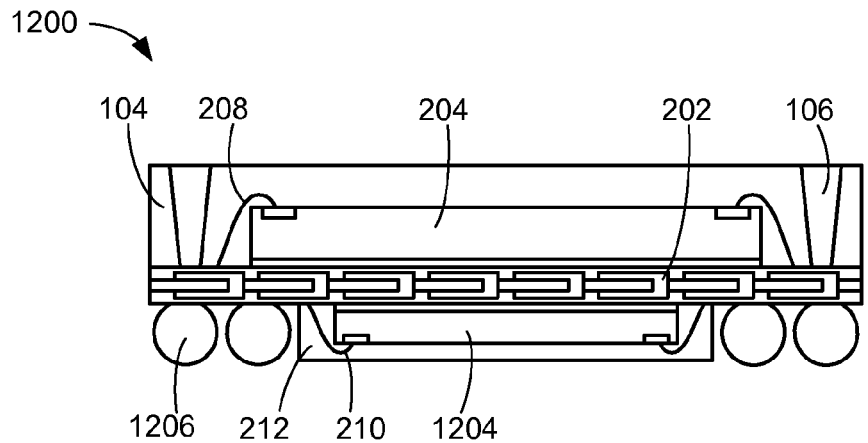
FIG. 12 is a cross-sectional view of an integrated circuit packaging system as exemplified by the top view of FIG. 1 along line 2-2 of FIG. 1 in a sixth embodiment of the present invention.

Referring now to FIG. 12, therein is shown a cross-sectional view of an integrated circuit packaging system 1200 as exemplified by the top view of FIG. 1 along line 2-2 of FIG. 1 in a sixth embodiment of the present invention. The integrated circuit packaging system 1200 can include the substrate 202.

The integrated circuit packaging system 1200 can also include the top integrated circuit 204 and a bottom integrated circuit 1204 each mounted on different sides of the substrate 202. The bottom integrated circuit 1204 is defined as a device with active circuitry thereon. For example, the bottom integrated circuit 1204 can be an unpackaged die, a packaged electronic module, a wire bonded die, or a flip chip die.

The top integrated circuit 204 and the bottom integrated circuit 1204 can be each attached to the different sides of the substrate 202. The integrated circuit packaging system 1200 can include the top interconnects 208. The top interconnects 208 can be attached to and between the substrate 202 and the top integrated circuit 204. The top interconnects 208 can be, for example, wires, ribbon bond wires, conductive bumps, solder balls, or other conductive structures.

The integrated circuit packaging system 1200 can include the bottom interconnects 210. The bottom interconnects 210 can be attached to and between the substrate 202 and the bottom integrated circuit 1204. The bottom interconnects 210 can be, for example, wires, ribbon bond wires, conductive bumps, solder balls, or other conductive structures.

The integrated circuit packaging system 1200 can include the top encapsulation 104. The top encapsulation 104 can encapsulate the top integrated circuit 204. The top encapsulation 104 can also encapsulate the top interconnects 208.

The top encapsulation 104 can include the top vias 106. The top encapsulation 104 can have characteristics of having been formed with a laser, including burn marks, melt marks, carbon residues, or a combination thereof on a surface of the top encapsulation 104 abutting the top vias 106.

The top vias 106 can be formed through the top encapsulation 104 to be electrically connected to the substrate 202. The top vias 106 can have a truncated conic shape. The top vias 106 can have a smaller surface area on a first surface where it is in direct contact with the substrate 202 compared to a second surface exposed from the top encapsulation 104. The top vias 106 can have finer pitches and smaller dimensions than embedded solder balls or conductive vertical columns due to its truncated conic shape. Further, because the top vias 106 can be formed with a laser drill, the top vias 106 can be made to be much smaller than other conductive structures formed prior to encapsulation.

It has been discovered that the use of the top vias 106 having a truncated conic shape formed through the top encapsulation 104 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the top vias 106 having a truncated conic shape formed through the top encapsulation 104 to the substrate 202 can leave room within the packages for attaching extra items while avoiding the precision equipment.

It has been unexpectedly found that forming the top vias 106 after forming the top encapsulation 104 allows for finer pitch contacts at the substrate 202. Precise placement of conductive structures on the substrate 202 can be difficult. However, drilling of the top encapsulation 104 can be made with a finer pitch using technologies such as lasers or mechanical drills after the top encapsulation 104 is formed. Accordingly, forming the top vias 106 after forming the top encapsulation 104 allows for finer pitch contacts at the substrate 202.

The integrated circuit packaging system 1200 can include the bottom encapsulation 212. The bottom encapsulation 212 can encapsulate the bottom integrated circuit 1204. The bottom encapsulation 212 can also encapsulate the bottom interconnects 210. The bottom encapsulation 212 can be formed simultaneously with the top encapsulation 104, such as with the same encapsulant or the same molding compound using a dual side mold. The bottom encapsulation 212 can have characteristics of having been formed with the top encapsulation 104 simultaneously, such as having reduced warpage, symmetrical warpage, or same cured encapsulant pattern.

The integrated circuit packaging system 1200 can include substrate interconnects 1206. The substrate interconnects 1206 is defined as conductive structures. For example, the substrate interconnects 1206 can be solder balls, conductive bumps, or conductive bonds. The substrate interconnects 1206 can be attached to the substrate 202. The substrate interconnects 1206 can be attached to the substrate 202 on the same side of the substrate 202 as the bottom integrated circuit 1204. The substrate interconnects 1206 can have the same height as the bottom encapsulation 212. The substrate interconnects 1206 can surround the bottom encapsulation 212.

It has been discovered that the integrated circuit packaging system 1200 having the top encapsulation 104, the bottom encapsulation 212, and the top vias 106 on the substrate 202 provides the present invention with reduced package profile and finer pitch. The integrated circuit packaging system 1200 requires only the substrate 202 to mount two integrated circuits on each side of the substrate 202. The top vias 106 provide electrical access to the substrate 202 and the integrated circuits without additional connector spacing. Accordingly, the top encapsulation 104 and the bottom encapsulation 212 having the top vias 106 on the substrate 202 provide the present invention with reduced package profile and finer pitch.

It has further been discovered that the integrated circuit packaging system 1200 having both the top encapsulation 104 and the bottom encapsulation 212 formed simultaneously over the substrate 202 provides the present invention with reduced package warpage. The top encapsulation 104 and the bottom encapsulation 212 on each side of the substrate 202 balance the rates of expansion of the package components and thus can minimize package warpage. Accordingly, the top encapsulation 104 and the bottom encapsulation 212 formed simultaneously provide the present invention with reduced package warpage.

Figure 13:
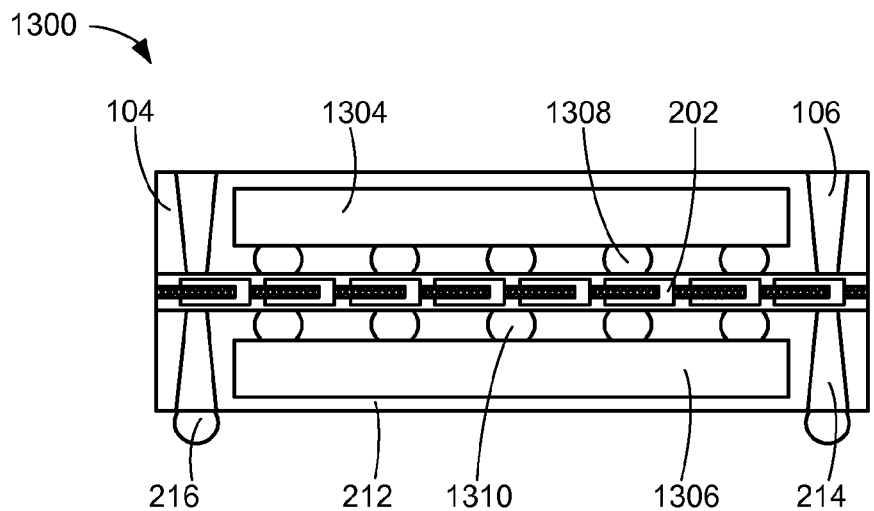
FIG. 13 is a cross-sectional view of an integrated circuit packaging system as exemplified by the top view of FIG. 1 along line 2-2 of FIG. 1 in a seventh embodiment of the present invention.

Referring now to FIG. 13, therein is shown a cross-sectional view of an integrated circuit packaging system 1300 as exemplified by the top view of FIG. 1 along line 2-2 of FIG. 1 in a seventh embodiment of the present invention. The integrated circuit packaging system 1300 can include the substrate 202.

The integrated circuit packaging system 1300 can also include a top integrated circuit 1304 and a bottom integrated circuit 1306 each mounted on different sides of the substrate 202. The top integrated circuit 1304 is defined as a device with active circuitry thereon. For example, the top integrated circuit 1304 can be an unpackaged die, a packaged electronic module, a wire bonded die, or a flip chip die.

The top integrated circuit 1304 and the bottom integrated circuit 1306 can be each attached to the different sides of the substrate 202. As a specific example, the top integrated circuit 1304 can be a flip chip die. As a specific example, the bottom integrated circuit 1306 can be a flip chip die.

The integrated circuit packaging system 1300 can include top interconnects 1308. The top interconnects 1308 are defined as conductive structures for routing electric signal or power. The top interconnects 1308 can be attached to and between the substrate 202 and the top integrated circuit 1304. The top interconnects 1308 can be, for example, solder balls or conductive bumps for flip chip connection.

The integrated circuit packaging system 1300 can include bottom interconnects 1310. The bottom interconnects 1310 are defined as conductive structures for routing electric signal or power. The bottom interconnects 1310 can be attached to and between the substrate 202 and the bottom integrated circuit 1306. The bottom interconnects 1310 can be, for example, solder balls or conductive bumps for flip chip connection.

The integrated circuit packaging system 1300 can include the top encapsulation 104. The top encapsulation 104 can encapsulate the top integrated circuit 1304. The top encapsulation 104 can also encapsulate the top interconnects 1308.

The top encapsulation 104 can include the top vias 106. The top encapsulation 104 can have characteristics of having been formed with a laser, including burn marks, melt marks, carbon residues, or a combination thereof on a surface of the top encapsulation 104 abutting the top vias 106.

The top vias 106 can be formed through the top encapsulation 104 to be electrically connected to the substrate 202. The top vias 106 can have a truncated conic shape. The top vias 106 can have a smaller surface area on a first surface where it is in direct contact with the substrate 202 compared to a second surface exposed from the top encapsulation 104. The top vias 106 can have finer pitches and smaller dimensions than embedded solder balls or conductive vertical columns due to its truncated conic shape. Further, because the top vias 106 can be formed with a laser drill, the top vias 106 can be made to be much smaller than other conductive structures formed prior to encapsulation.

It has been discovered that the use of the top vias 106 having a truncated conic shape formed through the top encapsulation 104 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the top vias 106 having a truncated conic shape formed through the top encapsulation 104 to the substrate 202 can leave room within the packages for attaching extra items while avoiding the precision equipment.

The integrated circuit packaging system 1300 can include the bottom encapsulation 212. The bottom encapsulation 212 can encapsulate the bottom integrated circuit 1306. The bottom encapsulation 212 can also encapsulate the bottom interconnects 1310. The bottom encapsulation 212 can be formed simultaneously with the top encapsulation 104, such as with the same encapsulant or the same molding compound using a dual side mold. The bottom encapsulation 212 can have characteristics of having been formed with the top encapsulation 104 simultaneously, such as having reduced warpage, symmetrical warpage, or same cured encapsulant pattern.

The bottom encapsulation 212 can include the bottom vias 214. The bottom encapsulation 212 can have characteristics of having been formed with a laser, including burn marks, melt marks, carbon residues, or a combination thereof on a surface of the bottom encapsulation 212 abutting the bottom vias 214. The bottom vias 214 can be formed through the bottom encapsulation 212 to be electrically connected to the substrate 202.

The bottom vias 214 can have a truncated conic shape. The bottom vias 214 can have a smaller surface area on a first surface where it is in direct contact with the substrate 202 compared to a second surface exposed from the bottom encapsulation 212. The bottom vias 214 can have finer pitches and smaller dimensions than embedded solder balls or conductive vertical columns due to its truncated conic shape. Further, because the bottom vias 214 can be formed with a laser drill, the bottom vias 214 can be made to be much smaller than other conductive structures formed prior to encapsulation.

It has been unexpectedly found that the use of the bottom vias 214 having a truncated conic shape formed through the bottom encapsulation 212 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the bottom vias 214 having a truncated conic shape formed through the bottom encapsulation 212 to the substrate 202 can leave room within the packages for attaching extra items while avoiding the precision equipment.

It has also been unexpectedly found that forming the bottom vias 214 after forming the bottom encapsulation 212 allows for finer pitch contacts at the substrate 202. Precise placement of conductive structures on the substrate 202 can be difficult. However, drilling of the bottom encapsulation 212 can be made with a finer pitch using technologies such as lasers or mechanical drills after the bottom encapsulation 212 is formed. Accordingly, forming the bottom vias 214 after forming the bottom encapsulation 212 allows for finer pitch contacts at the substrate 202.

The integrated circuit packaging system 1300 can include the first external interconnects 216. The first external interconnects 216 can be, for example, solder balls, conductive bumps, or conductive bonds. The first external interconnects 216 can be attached to the bottom vias 214.

It has been discovered that the integrated circuit packaging system 1300 having the top encapsulation 104, the bottom encapsulation 212, and the top vias 106 or the bottom vias 214 on the substrate 202 provides the present invention with reduced package profile and finer pitch. The integrated circuit packaging system 1300 requires only the substrate 202 to mount two integrated circuits on each side of the substrate 202. The top vias 106 or the bottom vias 214 provide electrical access to the substrate 202 and the integrated circuits without additional connector spacing. Accordingly, the top encapsulation 104 and the bottom encapsulation 212 having the top vias 106 or the bottom vias 214 on the substrate 202 provide the present invention with reduced package profile and finer pitch.

It has further been discovered that the integrated circuit packaging system 1300 having both the top encapsulation 104 and the bottom encapsulation 212 formed simultaneously over the substrate 202 provides the present invention with reduced package warpage. The top encapsulation 104 and the bottom encapsulation 212 on each side of the substrate 202 balance the rates of expansion of the package components and thus can minimize package warpage. Accordingly, the top encapsulation 104 and the bottom encapsulation 212 formed simultaneously provide the present invention with reduced package warpage.

Figure 14:
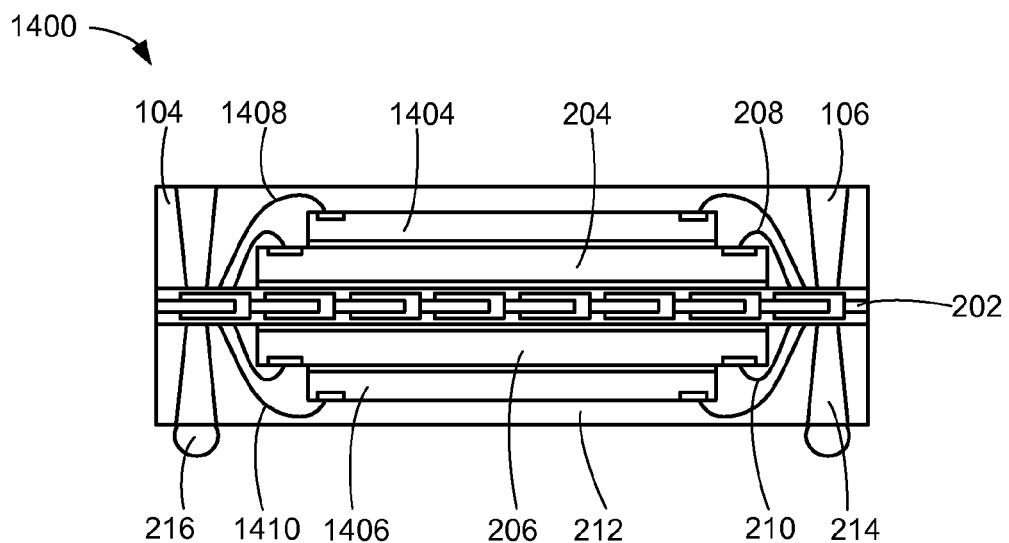
FIG. 14 is a cross-sectional view of an integrated circuit packaging system as exemplified by the top view of FIG. 1 along line 2-2 of FIG. 1 in a eighth embodiment of the present invention.

Referring now to FIG. 14, therein is shown a cross-sectional view of an integrated circuit packaging system 1400 as exemplified by the top view of FIG. 1 along line 2-2 of FIG. 1 in a eighth embodiment of the present invention. The integrated circuit packaging system 1400 can include the substrate 202.

The integrated circuit packaging system 1400 can also include the top integrated circuit 204 and the bottom integrated circuit 206 each mounted on different sides of the substrate 202. The top integrated circuit 204 and the bottom integrated circuit 206 can be each attached to the different sides of the substrate 202. The top integrated circuit 204 can be, for example, a wire bonded die or a flip chip die. The bottom integrated circuit 206 can be, for example, a flip chip die or a wire bonded die.

The integrated circuit packaging system 1400 can include the top interconnects 208. The top interconnects 208 can be attached to and between the substrate 202 and the top integrated circuit 204. The top interconnects 208 can be, for example, wires, ribbon bond wires, conductive bumps, solder balls, or other conductive structures.

The integrated circuit packaging system 1400 can include the bottom interconnects 210. The bottom interconnects 210 can be attached to and between the substrate 202 and the bottom integrated circuit 206. The bottom interconnects 210 can be, for example, wires, ribbon bond wires, conductive bumps, solder balls, or other conductive structures.

The integrated circuit packaging system 1400 can include an upper stacked integrated circuit 1404 mounted on and attached to the top integrated circuit 204. The upper stacked integrated circuit 1404 is defined as a device with active circuitry thereon. For example, the upper stacked integrated circuit 1404 can be an unpackaged die, a packaged electronic module, a wire bonded die, or a flip chip die.

The integrated circuit packaging system 1400 can include a lower stacked integrated circuit 1406 mounted on and attached to the bottom integrated circuit 206. The lower stacked integrated circuit 1406 is defined as a device with active circuitry thereon. For example, the lower stacked integrated circuit 1406 can be an unpackaged die, a packaged electronic module, a wire bonded die, or a flip chip die.

The integrated circuit packaging system 1400 can include upper interconnects 1408. The upper interconnects 1408 are defined as conductive structures for routing electric power or signal. The integrated circuit packaging system 1400 can include lower interconnects 1410. The lower interconnects 1410 are defined as conductive structures for routing electric power or signal.

The integrated circuit packaging system 1400 can include the top encapsulation 104. The top encapsulation 104 can encapsulate the top integrated circuit 204. The top encapsulation 104 can also encapsulate the top interconnects 208. The top encapsulation 104 can encapsulate the upper stacked integrated circuit 1404. The top encapsulation 104 can encapsulate the upper interconnects 1408.

The top encapsulation 104 can include the top vias 106. The top encapsulation 104 can have characteristics of having been formed with a laser, including burn marks, melt marks, carbon residues, or a combination thereof on a surface of the top encapsulation 104 abutting the top vias 106.

The top vias 106 can be formed through the top encapsulation 104 to be electrically connected to the substrate 202. The top vias 106 can have a truncated conic shape. The top vias 106 can have a smaller surface area on a first surface where it is in direct contact with the substrate 202 compared to a second surface exposed from the top encapsulation 104. The top vias 106 can have finer pitches and smaller dimensions than embedded solder balls or conductive vertical columns due to its truncated conic shape. Further, because the top vias 106 can be formed with a laser drill, the top vias 106 can be made to be much smaller than other conductive structures formed prior to encapsulation.

It has been discovered that the use of the top vias 106 having a truncated conic shape formed through the top encapsulation 104 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the top vias 106 having a truncated conic shape formed through the top encapsulation 104 to the substrate 202 can leave room within the packages for attaching extra items while avoiding the precision equipment.

The integrated circuit packaging system 1400 can include the bottom encapsulation 212. The bottom encapsulation 212 can encapsulate the bottom integrated circuit 206. The bottom encapsulation 212 can also encapsulate the bottom interconnects 210. The bottom encapsulation 212 can be formed simultaneously with the top encapsulation 104, such as with the same encapsulant or the same molding compound using a dual side mold. The bottom encapsulation 212 can have characteristics of having been formed with the top encapsulation 104 simultaneously, such as having reduced warpage, symmetrical warpage, or same cured encapsulant pattern. The bottom encapsulation 212 can encapsulate the lower stacked integrated circuit 1406. The bottom encapsulation 212 can encapsulate the lower interconnects 1410.

The bottom encapsulation 212 can include the bottom vias 214. The bottom encapsulation 212 can have characteristics of having been formed with a laser, including burn marks, melt marks, carbon residues, or a combination thereof on a surface of the bottom encapsulation 212 abutting the bottom vias 214. The bottom vias 214 can be formed through the bottom encapsulation 212 to be electrically connected to the substrate 202.

The bottom vias 214 can have a truncated conic shape. The bottom vias 214 can have a smaller surface area on a first surface where it is in direct contact with the substrate 202 compared to a second surface exposed from the bottom encapsulation 212. The bottom vias 214 can have finer pitches and smaller dimensions than embedded solder balls or conductive vertical columns due to its truncated conic shape. Further, because the bottom vias 214 can be formed with a laser drill, the bottom vias 214 can be made to be much smaller than other conductive structures formed prior to encapsulation.

It has been unexpectedly found that the use of the bottom vias 214 having a truncated conic shape formed through the bottom encapsulation 212 to the substrate 202 can leave more room within the packages for items like bond wires. For high reliable and low cost volume manufacturing, the mounting surfaces must provide larger surface area to avoid precision equipment allowing for high reliability mounting and attachment. Accordingly, the bottom vias 214 having a truncated conic shape formed through the bottom encapsulation 212 to the substrate 202 can leave room within the packages for attaching extra items while avoiding the precision equipment.

It has also been unexpectedly found that forming the bottom vias 214 after forming the bottom encapsulation 212 allows for finer pitch contacts at the substrate 202. Precise placement of conductive structures on the substrate 202 can be difficult. However, drilling of the bottom encapsulation 212 can be made with a finer pitch using technologies such as lasers or mechanical drills after the bottom encapsulation 212 is formed. Accordingly, forming the bottom vias 214 after forming the bottom encapsulation 212 allows for finer pitch contacts at the substrate 202.

The integrated circuit packaging system 1400 can include the first external interconnects 216. The first external interconnects 216 can be, for example, solder balls, conductive bumps, or conductive bonds. The first external interconnects 216 can be attached to the bottom vias 214.

It has been discovered that the integrated circuit packaging system 1400 having the top encapsulation 104, the bottom encapsulation 212, and the top vias 106 or the bottom vias 214 on the substrate 202 provides the present invention with reduced package profile and finer pitch. The integrated circuit packaging system 1400 requires only the substrate 202 to mount two integrated circuits on each side of the substrate 202. The top vias 106 or the bottom vias 214 provide electrical access to the substrate 202 and the integrated circuits without additional connector spacing. Accordingly, the top encapsulation 104 and the bottom encapsulation 212 having the top vias 106 or the bottom vias 214 on the substrate 202 provide the present invention with reduced package profile and finer pitch.

It has further been discovered that the integrated circuit packaging system 1400 having both the top encapsulation 104 and the bottom encapsulation 212 formed simultaneously over the substrate 202 provides the present invention with reduced package warpage. The top encapsulation 104 and the bottom encapsulation 212 on each side of the substrate 202 balance the rates of expansion of the package components and thus can minimize package warpage. Accordingly, the top encapsulation 104 and the bottom encapsulation 212 formed simultaneously provide the present invention with reduced package warpage.

Figure 15:
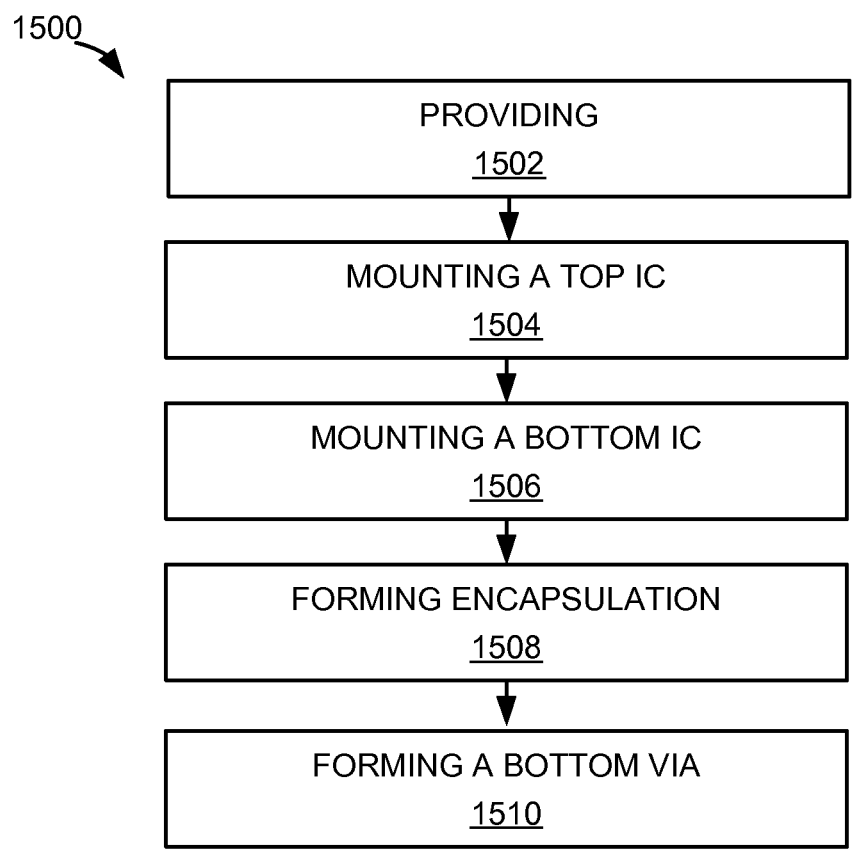
FIG. 15 therein is a flow chart of a method of manufacture of the integrated circuit packaging system in a further embodiment of the present invention.

Referring now to FIG. 15 therein is shown a flow chart of a method 1500 of manufacture of the integrated circuit packaging system 100 in a further embodiment of the present invention. The method 1500 includes: providing a substrate, in a block 1502; mounting a top integrated circuit on a first side of the substrate, in a block 1504; mounting a bottom integrated circuit on a second side of the substrate, in a block 1506; forming a top encapsulation over the top integrated circuit and a bottom encapsulation over the bottom integrated circuit simultaneously, in a block 1508; and forming a bottom via through the bottom encapsulation to the substrate, in a block 1510.

The resulting method, process, apparatus, device, product, and system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in art in light of aforegoing description. Accordingly, it is intended to embrace all such alternatives, modifications, and variations that fall within the scope of the included claims. All matters hithertofore set forth herein or shown in accompanying drawings are to be interpreted in an illustrative and non-limiting sense.

What is claimed is:

1. A method of manufacture of an integrated circuit packaging system comprising:
providing a substrate;
mounting a top integrated circuit on a first side of the substrate;
mounting a bottom integrated circuit on a second side of the substrate, wherein the second side is opposite the first side;

forming a top encapsulation over the top integrated circuit and a bottom encapsulation over the bottom integrated circuit simultaneously; and forming a bottom via through the bottom encapsulation to the substrate.

2. The method as claimed in claim 1 further comprising forming a first via through the bottom encapsulation to the bottom integrated circuit.

3. The method as claimed in claim 1 further comprising forming a second via through the top encapsulation to the top integrated circuit.

4. The method as claimed in claim 1 further comprising forming a top redistribution layer at a surface of the top integrated circuit.

5. The method as claimed in claim 1 wherein mounting the top integrated circuit includes mounting the top integrated circuit with a top interconnect between the top integrated circuit and the substrate.

6. A method of manufacture of an integrated circuit packaging system comprising:

providing a substrate;

mounting a top integrated circuit on a first side of the substrate;

mounting a bottom integrated circuit on a second side of the substrate;

forming a top encapsulation over the top integrated circuit and a bottom encapsulation over the bottom integrated circuit simultaneously; and forming a bottom via through the bottom encapsulation to the substrate, the bottom via having a truncated conic shape.

7. The method as claimed in claim 6 further comprising mounting an upper stacked integrated circuit attached to the top integrated circuit.

8. The method as claimed in claim 6 further comprising mounting a substrate interconnect on the substrate spaced apart from the bottom encapsulation.

9. The method as claimed in claim 6 further comprising forming a bottom redistribution layer at a surface of the bottom encapsulation facing away from the substrate.

10. The method as claimed in claim 6 wherein forming the bottom via includes forming a bottom hole of the bottom encapsulation with a laser.

11. An integrated circuit packaging system comprising:

a substrate;

a top integrated circuit mounted on the substrate;

a bottom integrated circuit mounted on an opposite side of the substrate from the top integrated circuit;

a top encapsulation over the top integrated circuit;

a bottom encapsulation over the bottom integrated circuit having characteristics of having been formed simultaneously with the top encapsulation; and a bottom via through the bottom encapsulation to the substrate.

12. The integrated circuit packaging system as claimed in claim 11 further comprising a first via through the bottom encapsulation to the bottom integrated circuit.

13. The integrated circuit packaging system as claimed in claim 11 further comprising a second via through the top encapsulation to the top integrated circuit.

14. The integrated circuit packaging system as claimed in claim 11 wherein the top integrated circuit includes a top redistribution layer.

15. The integrated circuit packaging system as claimed in claim 11 further comprising a top interconnects between the top integrated circuit and the substrate.

16. The integrated circuit packaging system as claimed in claim 11 wherein the bottom via has a truncated conic shape.

17. The integrated circuit packaging system as claimed in claim 16 further comprising an upper stacked integrated circuit attached to the top integrated circuit.

18. The integrated circuit packaging system as claimed in claim 16 further comprising a substrate interconnect on the substrate spaced apart from the bottom encapsulation.

19. The integrated circuit packaging system as claimed in claim 16 further comprising a bottom redistribution layer at a surface of the bottom encapsulation facing away from the substrate.

20. The integrated circuit packaging system as claimed in claim 16 wherein the bottom encapsulation includes characteristics of having been formed with a laser, including burn mark bordering the bottom via.

* * * * *